(12) United States Patent
Iwamuro et al.

(10) Patent No.: US 9,450,051 B2
(45) Date of Patent: Sep. 20, 2016

(54) HIGH VOLTAGE SEMICONDUCTOR APPARATUS

(71) Applicant: FUJI ELECTRIC CO., LTD., Kawasaki-shi, Kanagawa (JP)

(72) Inventors: Noriyuki Iwamuro, Tsukuba (JP); Shinsuke Harada, Tsukuba (JP); Yasuyuki Hoshi, Matsumoto (JP); Yuichi Harada, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/389,233

(22) PCT Filed: Mar. 14, 2013

(86) PCT No.: PCT/JP2013/057315
§ 371 (c)(1),
(2) Date: Sep. 29, 2014

(87) PCT Pub. No.: WO2013/146329
PCT Pub. Date: Oct. 3, 2013

(65) Prior Publication Data
US 2015/0340441 A1    Nov. 26, 2015

(30) Foreign Application Priority Data

Mar. 30, 2012 (JP) ................................. 2012-081736

(51) Int. Cl.
*H01L 29/15* (2006.01)
*H01L 29/10* (2006.01)
(Continued)

(52) U.S. Cl.
CPC ......... *H01L 29/1095* (2013.01); *H01L 21/046* (2013.01); *H01L 21/049* (2013.01);
(Continued)

(58) Field of Classification Search
CPC ... H01L 33/62; H01L 51/5012; H01L 51/56; H01L 51/0072; H01L 51/5056
USPC .................... 257/77, 328, E29.104
See application file for complete search history.

(56) References Cited

U.S. PATENT DOCUMENTS

| 3,997,551 A | 12/1976 | Minagawa et al. |
| 5,712,502 A | 1/1998 | Mitlehner et al. |

(Continued)

FOREIGN PATENT DOCUMENTS

| JP | 2005-223220 A | 8/2005 |
| JP | 2008-98536 A | 4/2008 |
| JP | 2010-045363 A | 2/2010 |

OTHER PUBLICATIONS

Notification of Transmittal of Translation of the International Preliminary Report on Patentability (Form PCT/IB/338) of International Application No. PCT/JP2013/057315 mailed Oct. 9, 2014 with Forms PCT/IB/373, PCT/ISA/237(with English Translation) and Form PCT/IB/326.

(Continued)

*Primary Examiner* — Andy Huynh
(74) *Attorney, Agent, or Firm* — Westerman, Hattori, Daniels & Adrian, LLP

(57) ABSTRACT

A vertical high voltage semiconductor apparatus includes a first conductivity semiconductor substrate; a first conductivity semiconductor layer disposed on the semiconductor substrate and having an impurity concentration lower than the semiconductor substrate; a second conductivity semiconductor layer disposed on the first conductivity semiconductor layer; a second conductivity base layer disposed on the first conductivity semiconductor layer and the second conductivity semiconductor layer and, having an impurity concentration lower than the second conductivity semiconductor layer; and a first conductivity source region selectively disposed inside the base layer. In an edge termination portion, after a region of the second conductivity semiconductor layer is removed, in the first conductivity semiconductor layer having an impurity concentration lower than that of the semiconductor substrate, second conductivity layers having a low concentration are formed such that the second conductivity layer at the innermost perimeter, the second conductivity semiconductor layer, and the base layer do not contact.

12 Claims, 10 Drawing Sheets

(51) Int. Cl.
  *H01L 29/16*   (2006.01)
  *H01L 29/66*   (2006.01)
  *H01L 29/06*   (2006.01)
  *H01L 29/78*   (2006.01)
  *H01L 21/04*   (2006.01)
  *H01L 29/04*   (2006.01)
  *H01L 29/872*  (2006.01)
  *H01L 29/868*  (2006.01)
  *H01L 29/08*   (2006.01)

(52) U.S. Cl.
  CPC ......... *H01L 29/045* (2013.01); *H01L 29/0619* (2013.01); *H01L 29/0661* (2013.01); *H01L 29/1608* (2013.01); *H01L 29/6606* (2013.01); *H01L 29/66068* (2013.01); *H01L 29/7811* (2013.01); *H01L 29/0878* (2013.01); *H01L 29/868* (2013.01); *H01L 29/872* (2013.01)

(56) References Cited

U.S. PATENT DOCUMENTS

| | | | |
|---|---|---|---|
| 6,002,159 A | 12/1999 | Bakowski et al. | |
| 2003/0178672 A1* | 9/2003 | Hatakeyama | H01L 29/0615 257/328 |
| 2007/0170436 A1 | 7/2007 | Sugawara | |
| 2010/0012951 A1 | 1/2010 | Yatsuo et al. | |
| 2010/0032685 A1* | 2/2010 | Zhang | H01L 29/0615 257/77 |
| 2013/0062620 A1* | 3/2013 | Henning | H01L 29/872 257/77 |

OTHER PUBLICATIONS

Deboy et al., "A new generation of high voltage MOSFETs breaks the limit line of silicon", IEEE IEDM, 1998, pp. 683.
Fujihira, "Theory of Semiconductor Superjunction Devices", Jpn. J. Appl. Phys., vol. 36, Part 1, No. 10, Oct. 1997, p. 6254.
Shenai et al., "Optimum Semiconductors for High-Power Electronics", IEEE Transactions on Electron Devices, vol. 36, No. 9, Sep. 1989, p. 1811.
Temple et al., "Junction Termination Extension for Near-Ideal Breakdown Voltage in p-n Junctions", IEEE Transactions on Electron Devices, vol. ED33, No. 10, Oct. 1986, p. 1601.
Wang et al., "Effect of Contact Resistivities and Interface Properties on the Performance of SiC Power Devices", Proceeding of 1992 International Symposium on Power Semiconductor Devices & ICs, Tokyo, 1992, pp. 303-308.
International Search Report dated Apr. 16, 2013 issued in corresponding application No. PCT/JP2013/057315.
Japanese Office Action dated Oct. 20, 2015, issued in corresponding JP Patent Application No. 2012-081736, with partial English translation (8 pages).

* cited by examiner (2) FORMATION OF P+-LAYER (a) ACTIVE REGION (b) SURROUNDING VOLTAGE WITHSTANDING STRUCTURE (3) GROWTH OF P-EPI (a) ACTIVE REGION (b) SURROUNDING VOLTAGE WITHSTANDING STRUCTURE (a) ACTIVE REGION (b) SURROUNDING VOLTAGE WITHSTANDING STRUCTURE (a) ACTIVE REGION (b) SURROUNDING VOLTAGE WITHSTANDING STRUCTURE (a) ACTIVE REGION  
(b) SURROUNDING VOLTAGE WITHSTANDING STRUCTURE (a) ACTIVE REGION  
(b) SURROUNDING VOLTAGE WITHSTANDING STRUCTURE (a) ACTIVE REGION (b) SURROUNDING VOLTAGE WITHSTANDING STRUCTURE

FIG.14

P-- LAYER 12

| | | 4.0*10¹³cm⁻² | 6.0*10¹²cm⁻² | 8.0*10¹²cm⁻² | 1.0*10¹³cm⁻² | 1.2*10¹³cm⁻² | 1.4*10¹³cm⁻² | 1.6*10¹³cm⁻² | 1.8*10¹³cm⁻² | 2.0*10¹³cm⁻² |
|---|---|---|---|---|---|---|---|---|---|---|
| | Dose量 | | | | | | | | | |
| | 3.0*10¹³cm⁻² | 1418V | 1428V | 1442V | 1448V | 1441V | | 1422V | | 1410V |
| | 4.0*10¹³cm⁻² | | | 1438V | 1450V | 1442V | | | | 1419V |
| | 5.0*10¹³cm⁻² | 1440V | 1442V | 1448V | 1452V | 1447V | 1440V | 1435V | 1432V | 1425V |
| | 6.0*10¹³cm⁻² | 1440V | 1450V | 1452V | 1450V | 1450V | 1450V | 1440V | 1435V | 1430V |
| | 7.0*10¹³cm⁻² | 1430V | 1435V | 1445V | 1452V | 1440V | 1441V | 1440V | 1432V | 1425V |
| | 8.0*10¹³cm⁻² | 1420V | 1422V | 1440V | 1450V | 1435V | 1435V | 1440V | 1432V | 1421V |
| P-LAYER 11 | 9.0*10¹³cm⁻² | | | 1435V | 1440V | 1432V | | | | |
| | 1.0*10¹⁴cm⁻² | | | 1430V | 1430V | 1432V | | | | |
| | 1.1*10¹⁴cm⁻² | | | 1422V | 1425V | 1421V | | | | |
| | 1.2*10¹⁴cm⁻² | 1412V | | 1418V | 1420V | 1418V | | | | 1402V |

FIG.15

| Dose | $4.0*10^{12}cm^{-2}$ | $6.0*10^{12}cm^{-2}$ | $8.0*10^{12}cm^{-2}$ | $1.0*10^{13}cm^{-2}$ | $1.2*10^{13}cm^{-2}$ | $1.4*10^{13}cm^{-2}$ | $1.6*10^{13}cm^{-2}$ | $1.8*10^{13}cm^{-2}$ | $2.0*10^{13}cm^{-2}$ |
|---|---|---|---|---|---|---|---|---|---|
| $3.0*10^{13}cm^{-3}$ | 650V | 950V | 1145V | 1201V | 1065V | | | | 758V |
| $4.0*10^{13}cm^{-3}$ | | | 1258V | 1352V | 1095V | | 865V | | 850V |
| $5.0*10^{13}cm^{-3}$ | 1254V | 1312V | 1385V | 1420V | 1210V | 1156V | 1056V | 995V | 950V |
| $6.0*10^{13}cm^{-3}$ | 1285V | 1321V | 1410V | 1451V | 1421V | 1325V | 1255V | 1152V | 995V |
| $7.0*10^{13}cm^{-3}$ | 1115V | 1295V | 1352V | 1410V | 1395V | 1310V | 1158V | 1085V | 912V |
| $8.0*10^{13}cm^{-3}$ | 1158V | 1251V | 1347V | 1388V | 1352V | 1201V | 1085V | 1002V | 845V |
| $9.0*10^{13}cm^{-3}$ | | | 1263V | 1380V | 1252V | | | | |
| $1.0*10^{14}cm^{-3}$ | | | 1153V | 1200V | 1165V | | | | |
| $1.1*10^{14}cm^{-3}$ | | | 1075V | 1120V | 1065V | | | | |
| $1.2*10^{14}cm^{-3}$ | 850V | | 962V | 1020V | 962V | | | | 820V |

(Rows: P- LAYER 11; Columns: P-- LAYER 12)

HIGH VOLTAGE SEMICONDUCTOR APPARATUS

TECHNICAL FIELD

The present invention relates to a power semiconductor apparatus capable of controlling high current and high voltage, and particularly to a high voltage semiconductor apparatus such as a vertical high voltage MOSFET apparatus, an insulated gate bipolar transistor (IGBT), a Schottky barrier diode (SBD), and a p-intrinsic-n (PiN) diode that use, as a semiconductor material, silicon carbide (SiC), which is a semiconductor material having a band gap wider than that of silicon (Si).

BACKGROUND ART

Single-crystal silicon is conventionally used as a material for a high voltage power semiconductor device controlling a high current. Various types of power semiconductor devices exist and each is used for a purpose suitable therefor. For example, a bipolar transistor and an insulated gate bipolar transistor (IGBT) can respectively handle a high current density but these transistors are incapable of high speed switching. Frequency limits for the bipolar transistor and the IGBT are on the order of several kHz and about 20 kHz, respectively. On the other hand, although a power MOSFET (metal oxide semiconductor field effect transistor) cannot handle high current, this transistor can switch at high speeds up to several MHz.

Nonetheless, in the market, demand is strong for a power device that can cope with both high current and high speed, and efforts have been made to improve the IGBT, the power MOSFET, etc. Therefore, at present, development has advanced to the extent that the performance substantially reaches theoretical limitation decided by the materials. FIG. 1 is a cross-sectional diagram of a structure of a common MOSFET. A high concentration $n^+$-source layer d is formed that is selectively formed in a surface layer of a P-base layer c deposited on an $n^-$-drift layer b, and a gate electrode f is formed through a gate insulating film e on the surface of the low concentration $n^-$-drift layer b, the P-base layer c, and the $n^+$-source layer d.

A superjunction MOSFET has recently attracted attention. The theory of the superjunction MOSFET was reported by Fujihira, in 1997 (see, e.g., Non-Patent Literature 1 below) and this MOSFET was established as a product called "CoolMOS" by Deboy, et al., in 1998 (see, e.g., Non-Patent Literature 2 below). The superjunction MOSFET is characterized in that the ON-resistance thereof is significantly improved without degrading the breakdown voltage between the source and the drain, by forming a P-layer in a columnar structure along a vertical direction (the depth direction) in the $n^-$-drift layer.

Investigations concerning the material from the viewpoint of the power semiconductor device have been conducted and Shenai, et al., reported a power semiconductor device using SiC as the semiconductor material (see, e.g., Non-Patent Literature 3 below). SiC has recently attracted attention for next generation power semiconductor devices as it is excellent with regard to low ON-voltage, high speed properties, and high temperature properties. The reason for this is that SiC is a highly stable material chemically, has a wide band gap that is three eV, and can be used very stably as a semiconductor at high temperatures. The critical electric field of SiC is higher than that of silicon by one or more digit(s).

The material performance of SiC can exceed the limit of the material performance of silicon and therefore, the future growth of SiC is highly expected in uses for power semiconductors, especially, MOSFETs. Expectations especially for the low ON-resistance are high, and a vertical SiC-MOSFET is counted on that facilitates further reduction of the ON-resistance maintaining the high voltage.

The cross-sectional structure of a common SiC-MOSFET is the structure depicted in FIG. 1 similarly to that of the silicon. The P-base layer c is deposited on the $n^-$-drift layer b and the $n^+$-source layer d is selectively formed in the surface layer of the P-base layer c (the surface layer on the side opposite to that of the $n^-$-drift layer b). The gate electrode f is formed through the gate insulating film e on the surface of the $n^-$-drift layer b, the P-base layer c, and the $n^+$-source layer d. The $n^-$-drift layer b is deposited on the front face of a substrate "a" and a drain electrode g is formed on the back face of the substrate "a".

It is expected that the SiC-MOSFET will be utilized, as a switching device, in a power conversion equipment such as a motor control inverter or an uninterruptible power supply (UPS) as a device capable of high-speed switching with low ON-resistance. SiC is a wide band gap semiconductor material; therefore, the critical electric field strength is high and about 10 times that of silicon as above; and may be able to sufficiently reduce the ON-resistance.

For example, in the case of the MOSFET, when high voltage is applied between the source and drain, the high voltage is applied to not only the active region but also to the edge termination structure surrounding the active region. In the edge termination structure, a depletion layer is expanded along the horizontal direction (a direction perpendicular to the depth direction) when the high voltage is applied thereto. Therefore, the edge termination structure tends to be influenced by charges on the device surface and as a result, the breakdown voltage thereof may be unstable. A junction termination extension (JTE) structure published by T. K. Wang, et al, (see, e.g., Non-Patent Literature 4 below) is famous as an edge termination structure for a SiC device.

Patent Documents 1 to 3 below are disclosed as examples that are first disclosed as a Si power device (see, e.g., Non-Patent Literature 5 below) and that are applied to SiC. However, the JTE structure has a disadvantage in that the breakdown voltage significantly varies due to the variations in the impurity concentration in the P-layer. Consequently, this is also a serious problem for Si devices and therefore, it is estimated that the same problem arises for the SiC device.

Patent Document 1: U.S. Pat. No. 6,002,159
Patent Document 2: U.S. Pat. No. 5,712,502
Patent Document 3: U.S. Pat. No. 3,997,551
Non-patent Literature 1: Fujihira, JJAP Vol. 36, Part 1, No. 10, pp. 6254, 1997
Non-patent Literature 2: Deboy, et al, IEEE IEDM 1998, pp. 683
Non-patent Literature 3: IEEE Transaction on Electron Devices, Vol. 36, p. 1811, 1989
Non-patent Literature 4: IEEE ISPSD, 1992, pp. 303-308
Non-patent Literature 5: Temple IEEE Transaction on Electron DeVices, Vol. ED33, Vol. 10, PP. 1601, 1986

DISCLOSURE OF INVENTION

Problem to be Solved by the Invention

As described, the material performance of SiC can exceed the limit of the material performance of silicon and therefore, the future growth of SiC is highly expected in uses for power semiconductors, especially, MOSFETs and IGBTs. Therefore, an object of the present invention is to provide a device structure whose breakdown voltage is not affected by slight differences arising from the device production process and that stably presents a high breakdown voltage.

Means for Solving Problem

To solve the problems above and achieve an object, the high voltage semiconductor apparatus according to the present invention has the following characteristics. A first conductivity type semiconductor layer (2) having a lower impurity concentration that a semiconductor substrate (1) is disposed on a front face of the semiconductor substrate (1). In a surface layer of the first conductivity type semiconductor layer (2), a second conductivity type semiconductor layer (3) is selectively disposed. On the first conductivity type semiconductor layer (2) and the second conductivity type semiconductor layer (3), a second conductivity type base layer (4) having a lower impurity concentration than the second conductivity type semiconductor layer (3) is disposed. Inside the base layer (4), a first conductivity type source region (7) is selectively disposed. A first conductivity type well region (6) is disposed from a surface of the base layer (4) and penetrating the base layer (4) in a direction of depth to reach the first conductivity type semiconductor layer (2). Between the first conductivity type source region (7) and the first conductivity type well region (6), a gate electrode layer is disposed through a gate insulating film in at least a portion of an exposed portion of the surface of the base layer (4). A source electrode in contact with surfaces of the first conductivity type source region (7) and the base layer (4) is disposed. A drain electrode is disposed on a back face of the semiconductor substrate (1). A recess penetrating a portion of the base layer (4) in an edge termination portion along a direction of depth and reaching the first conductivity type semiconductor layer (2), and second conductivity type layers (11 and 12) disposed on a surface of the first conductivity type semiconductor layer (2) exposed on a bottom face of the recess, and each having an impurity concentration lower than that of the second conductivity type semiconductor layer (3) are disposed. The second conductivity type layer (11) at an innermost perimeter is disposed such that the second conductivity type layer (11) is not in contact with the second conductivity type semiconductor layer (3) and the base layer (4).

In the high voltage semiconductor apparatus according to the present invention, the first conductivity type semiconductor layer (2) is an epitaxially grown layer, the second conductivity type semiconductor layer (3) is a diffusion layer formed using an ion implantation method, the base layer (4) is an epitaxially grown layer, the first conductivity type source region (7) is a diffusion layer formed using an ion implantation method, and the first conductivity type well region (6) is a diffusion layer formed using an ion implantation method.

In the high voltage semiconductor apparatus according to the present invention, a distance between the second conductivity type layer (11) at the innermost perimeter, and the second conductivity type semiconductor layer (3) and the base layer (4) is 20 µm or less.

In the high voltage semiconductor apparatus according to the present invention, the semiconductor material is silicon carbide.

In the high voltage semiconductor apparatus according to the present invention, the front face of the semiconductor substrate (1) is a surface parallel to a surface whose crystallographic plane indices are (000-1) or a surface inclined by an angle within 10 degrees with respect thereto.

In the high voltage semiconductor apparatus according to the present invention, the front face of the semiconductor substrate (1) is a surface parallel to a surface whose crystallographic plane indices are (0001) or a surface inclined by an angle within 10 degrees with respect thereto.

According to the above invention, the breakdown voltage is not affected by the impurity concentrations of the $P^+$-layer 3 in the active region and the N-type semiconductor layer 2, or by the device structure; and a high breakdown voltage can be achieved stably even when the impurity concentrations vary of the $P^-$-layer 11 and the $P^{--}$-layer 12 constituting the JTE layer. The reason for this is that the breakdown voltage can necessarily be determined based on the PN junctions between the $P^+$-layer 3, and the P-type base layer 4 and the n-type SiC layer 2 and therefore, the breakdown voltage of the device is determined based on the PN junctions even when the impurity concentrations of the $P^-$-layer 11 and the $P^{--}$-layer 12 constituting the JTE layer disperse and the breakdown voltage determined based on the JTE layer varies.

According to the above invention, when the P-type base layer 4 is formed using the epitaxial growth method, the surface of the P-type base layer 4 in the interface with the gate oxide film can be made flat substantially without any surface roughness and therefore, the mobility becomes extremely high in the MOS gate (an insulated gate including a metal/an oxide film/a semiconductor) portion in the vicinity of the surface of the P-type base layer 4. As a result, the ON-resistance can be further reduced. According to the above invention, when the semiconductor material is silicon carbide, a surface parallel to a surface whose crystallographic plane indices are (000-1) or a surface inclined by an angle within 10 degrees with respect thereto is set as the principal surface (the front face) of the n-type semiconductor substrate 1, or a surface parallel to a surface whose crystallographic plane indices are (0001) or a surface inclined by an angle within 10 degrees with respect thereto is set as the principal surface (the front face) of the n-type semiconductor substrate 1. Thereby, the interface state density can be reduced of the interface between the gate oxide film and the semiconductor. Thus, the mobility in the MOS gate portion can further be improved and as a result, the ON-resistance can be extremely reduced.

Effect of the Invention

According to the high voltage semiconductor apparatus according to the present invention, an effect is achieved that the breakdown voltage is not affected by slight differences consequent to the device production process, and a device structure can be provided that stably presents a high breakdown voltage.

BRIEF DESCRIPTION OF DRAWINGS

FIG. 14 is a table showing the breakdown voltages obtained when the dose amounts for the P$^-$-layer 11 and the P$^{---}$-layer 12 in the conventional example are varied (1,200 V/25 A rating); and FIG. 15 is a table showing the breakdown voltages obtained when the dose amounts for the P$^-$-layer 11 and the P$^{---}$-layer 12 in the present example are varied (1,200 V/25 A rating).

BEST MODE(S) FOR CARRYING OUT THE INVENTION

Figure 1:
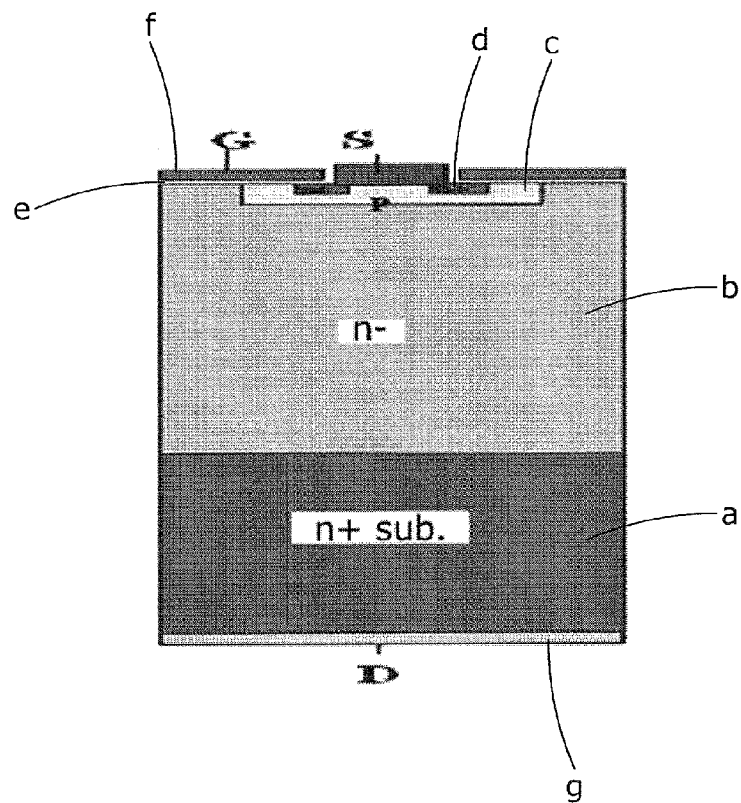
FIG. 1 is a cross-sectional view of a structure of a common MOSFET.

Preferred embodiments of the high voltage semiconductor apparatus according to the present invention will be described as examples with reference to the accompanying drawings. In the accompanying drawings and herein, the layers and the regions each having "n" or "p" attached at the head thereof mean that the majority carriers of each of the layers and the regions respectively are electrons or holes. "+" and "−" appended to "n" and "p" mean that the impurity concentrations are respectively higher and lower than those of the layers and regions without "+" and "−". In the description of the embodiments and the accompanying drawings, identical configurations are given the same reference numerals and redundant description is omitted.

First Example

A high voltage semiconductor apparatus according to the embodiment of the present invention will be described together with a fabrication process thereof with reference to FIGS. 2 to 10. In each of FIGS. 2 to 10, (a) on the left side depicts a cross-sectional diagram of an active region and (b) on the right side depicts a cross-sectional diagram of a edge termination structure. In a first example, a MOSFET is described that has a vertical planar gate structure, that uses silicon carbide (SiC) as the semiconductor material, and whose voltage rating is 1,200 V. Although it is assumed that a first conductivity type is an N type and a second conductivity type is a P type, the first conductivity type may be the P type and the second conductivity type may be the N type.

Figure 2:
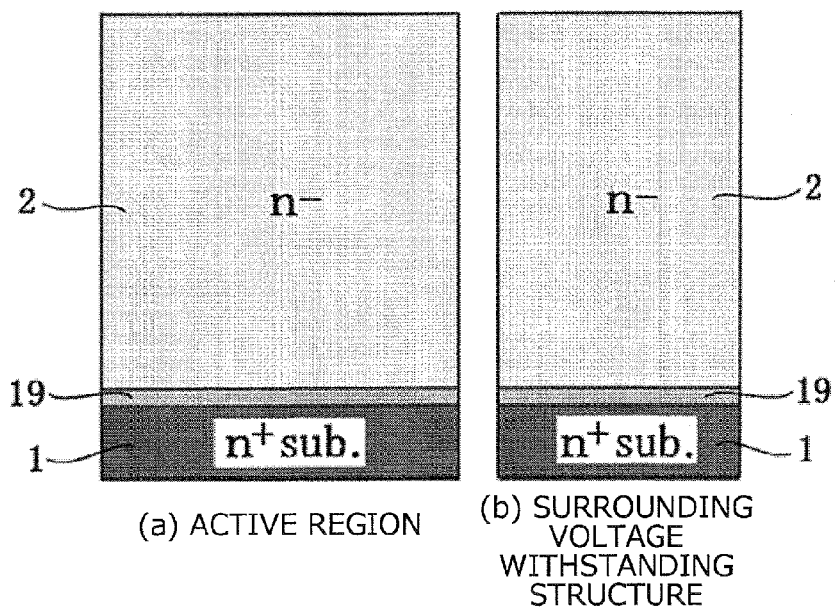
FIG. 2 is a cross-sectional diagram of a SiC-MOSFET fabrication process (formation of an n-type SiC layer 2 by epitaxial growth) of a first example of the present invention.

(1) FIG. 2 is a cross-sectional diagram of a SiC-MOSFET fabrication process (formation of an n-type SiC layer 2 by epitaxial growth) of the first example of the present invention. As depicted in FIG. 2, an n-type semiconductor substrate 1 made from SiC is prepared. In the first example, a low resistivity SiC semiconductor (the n-type semiconductor substrate) 1 is prepared including nitrogen as the impurity at about $2\times10^{19}$ cm$^{-3}$. A surface inclined by about four degrees with respect to a surface whose crystallographic plane indices are (000-1) is set as the principal surface (the front face) of the n-type semiconductor substrate 1. An n-type SiC layer 2 including nitrogen at about $1.0\times10^{16}$ cm$^{-3}$ is epitaxially grown to have a thickness of about 10 μm on the principal surface. At this time, as depicted in FIG. 2, a high concentration n-type layer 19 having a thickness of about 1.0 μm may be disposed between the n-type semiconductor substrate 1 and the n-type SiC layer 2. In the notation of Miller's index used herein, "−" means a bar that is appended to the index immediately thereafter, and by appending "−" before the index indicates that the index is a negative.

Figure 3:
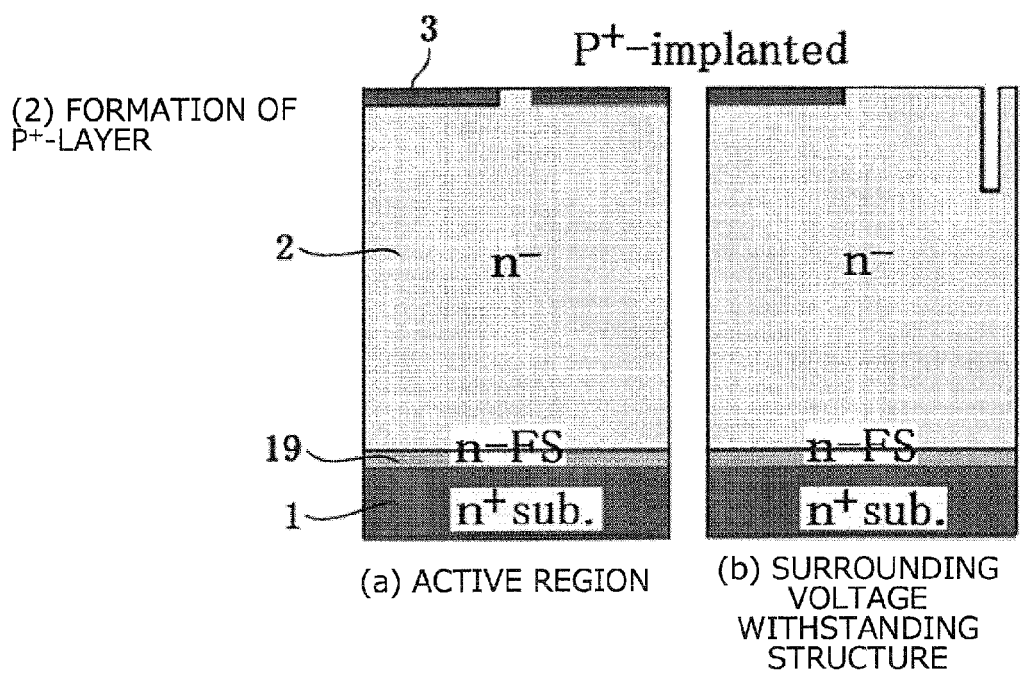
FIG. 3 is a cross-sectional diagram of the SiC-MOSFET fabrication process (formation of a $P^+$-layer 3 by ion implantation) of the first example of the present invention.
Figure 4:
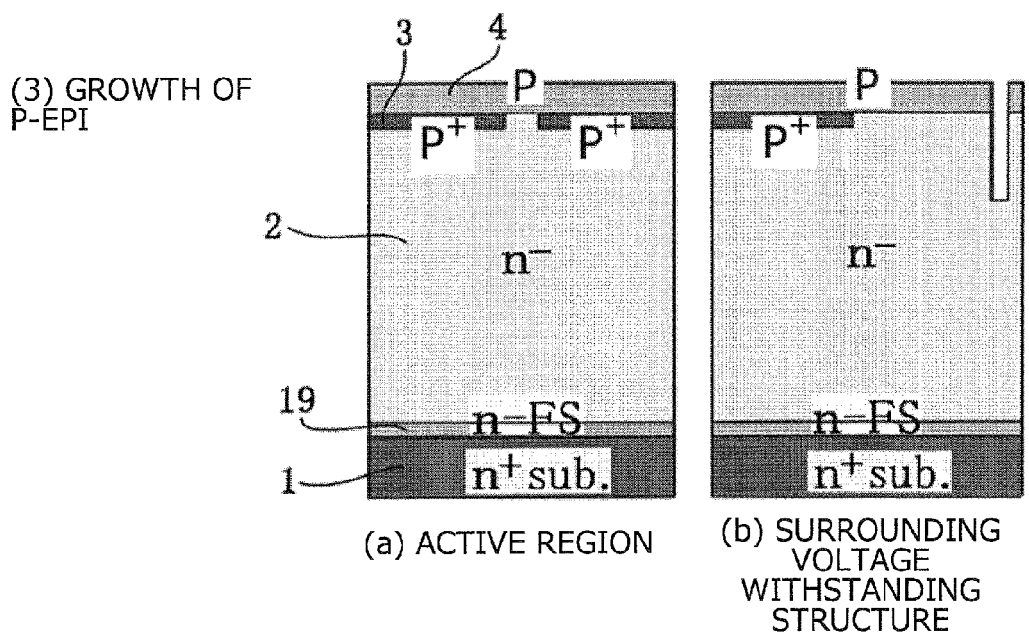
FIG. 4 is a cross-sectional diagram of the SiC-MOSFET fabrication process (formation of a P-base layer 4 by epitaxial growth) of the first example of the present invention.

(2) FIG. 3 is a cross-sectional diagram of the SiC-MOSFET fabrication process (formation of a P$^+$-layer 3 by ion implantation) of the first example of the present invention. As depicted in FIG. 3, the P$^+$-layer 3 having, for example, a width of 13 μm and a depth of 0.5 μm is formed in the surface of the n-type SiC layer 2 by an ion implantation method. In the ion implantation to form the P$^+$-layer 3, aluminum (Al) is used as the impurity ion to be implanted. The dose amount is set such that the impurity concentration of the P$^+$-layer 3 is $1.0\times10^{18}$ cm$^{-3}$. Although the planar shape of the P$^+$-layer 3 is made in a hexagonal cell pattern in the first embodiment, a square cell pattern or a stripe pattern causes no problem. The distance between the P$^+$-layers 3 is set to be 2 μm. FIG. 4 is a cross-sectional diagram of the SiC-MOSFET fabrication process (formation of a P-base layer 4 by epitaxial growth) of the first example of the present invention. Thereafter, as depicted in FIG. 4, the P-base layer 4 is formed to have a thickness of, for example, 0.5 μm on the P$^+$-layer 3 and the n-type SiC layer 2 by the epitaxial growth method. Aluminum is used as the impurity for forming the P-base layer 4 and its impurity concentration is set to be, for example, $2.0\times10^{16}$ cm$^{-3}$.

Figure 6:
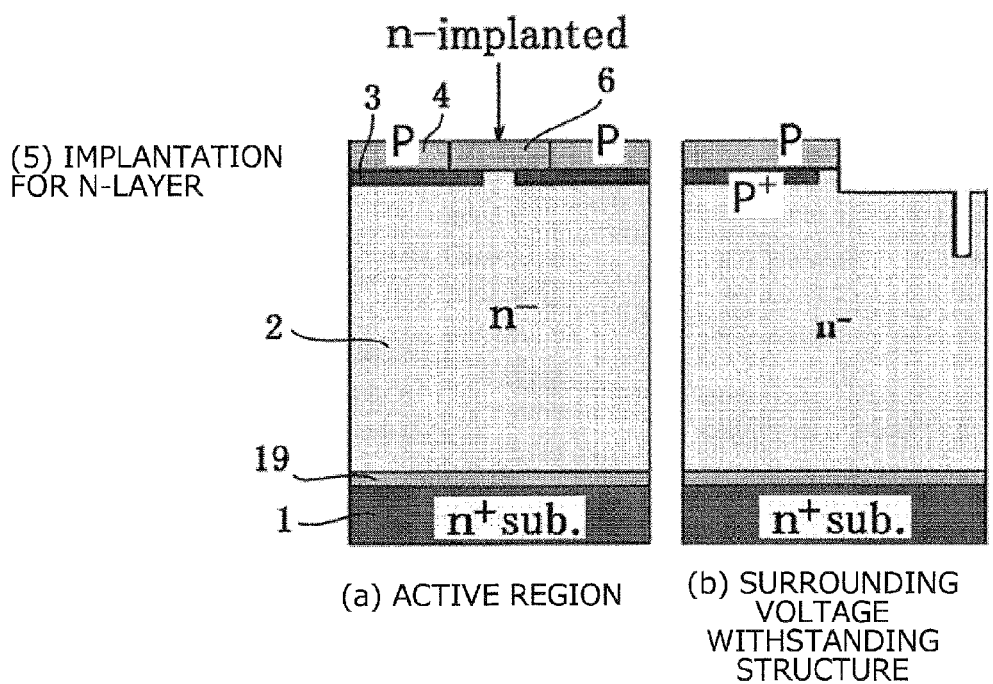
FIG. 6 is a cross-sectional diagram of the SiC-MOSFET fabrication process (formation of an N-layer 6 by ion implantation) of the first example of the present invention.
Figure 7:
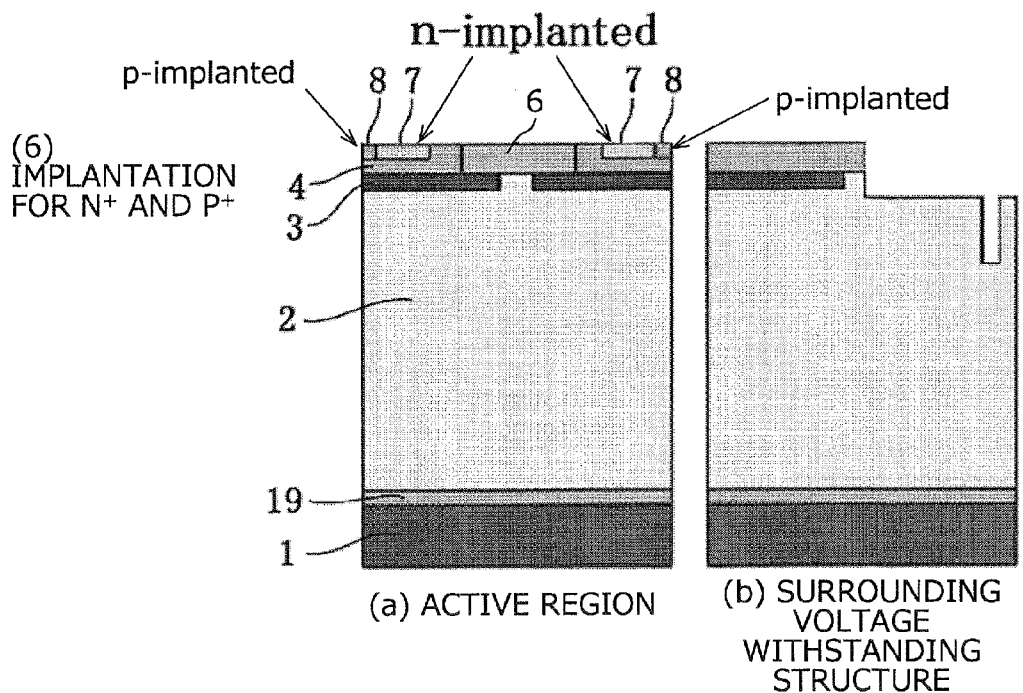
FIG. 7 is a cross-sectional diagram of the SiC-MOSFET fabrication process (formation of an N$^+$-source layer 7 and a P$^+$-contact layer 8 by ion implantation) of the first example of the present invention.
Figure 8:
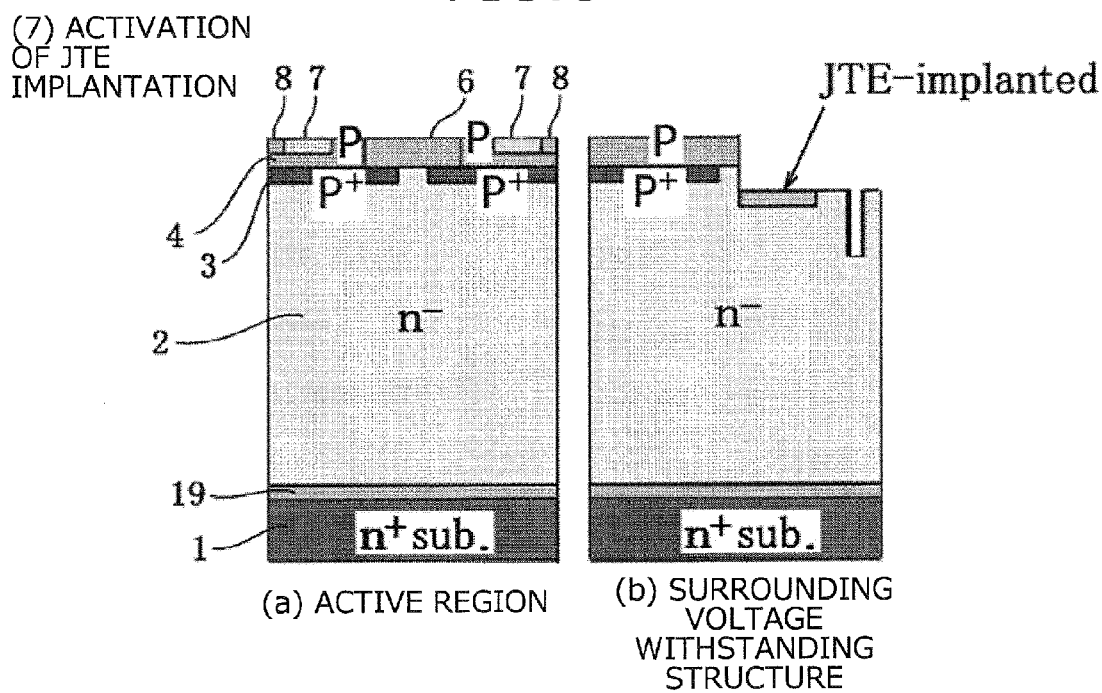
FIG. 8 is a cross-sectional diagram of the SiC-MOSFET fabrication process (activation of a P$^-$-layer 11 and a P$^{---}$-layer 12) of the first example of the present invention.

FIG. 6 is a cross-sectional diagram of the SiC-MOSFET fabrication process (formation of an N-layer 6 by ion implantation) of the first example of the present invention. FIG. 7 is a cross-sectional diagram of the SiC-MOSFET fabrication process (formation of an N$^+$-source layer 7 and a P$^+$-contact layer 8 by ion implantation) of the first example of the present invention. FIG. 8 is a cross-sectional diagram of the SiC-MOSFET fabrication process (activation of a P$^-$-layer 11 and a P$^{---}$-layer 12) of the first example of the present invention. Thereafter, as depicted in FIG. 6, nitrogen ions are selectively implanted as the N-layer 6 such that, for example, the impurity concentration is $5.0\times10^{16}$ cm$^{-3}$, with a depth of 1.5 μm and a width of 2.0 μm. As depicted in FIG. 7, the N$^+$-source layer 7 and the P$^+$-contact layer 8 are selectively formed inside the P-base layer 4. Thereafter, as depicted in FIG. 8, "JTE-implanted" is formed by aluminum ion implantation of the dose amount of $1.6\times10^{13}$ cm$^{-2}$, and activation annealing is executed therefor. The heat treatment temperature of the activation annealing is set to be, for example, 1,620 degrees C. and the time period thereof is set to be, for example, two minutes.

Figure 9:
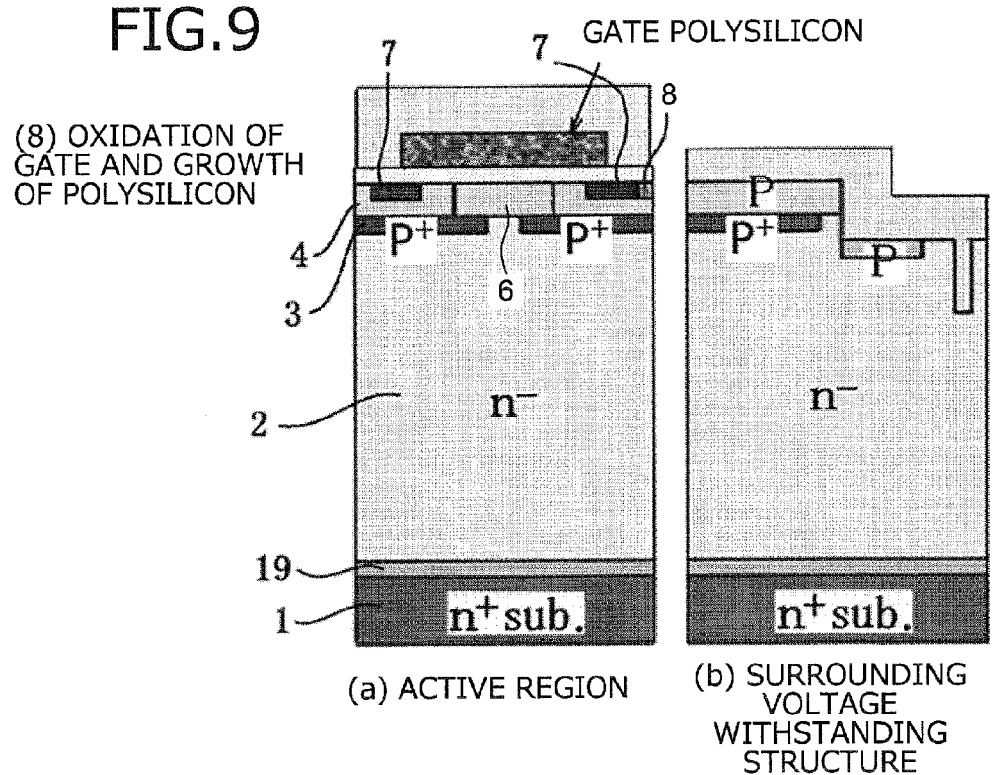
FIG. 9 is a cross-sectional diagram of the SiC-MOSFET fabrication process (formation of a gate oxide polysilicon layer by epitaxial growth) of the first example of the present invention.
Figure 10:
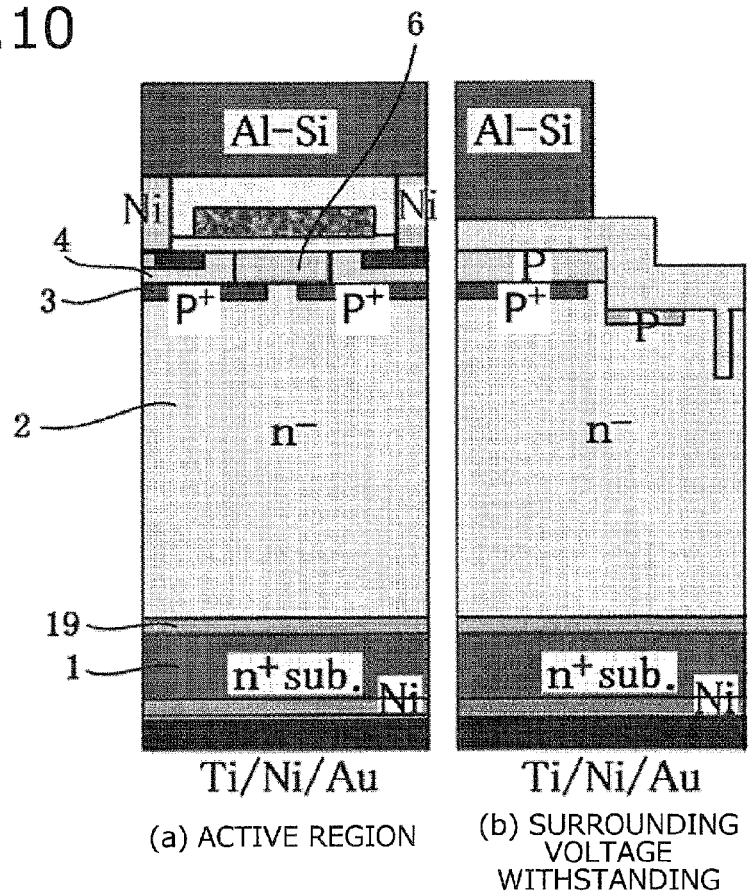
FIG. 10 is a cross-sectional diagram of the SiC-MOSFET fabrication process (formation of a front face electrode) of the first example of the present invention.

FIG. 9 is a cross-sectional diagram of the SiC-MOSFET fabrication process (formation of a gate oxide polysilicon layer by epitaxial growth) of the first example of the present invention. FIG. 10 is a cross-sectional diagram of the SiC-MOSFET fabrication process (formation of a front face electrode) of the first example of the present invention. Thereafter, a gate oxide film having a thickness of 100 nm is formed by thermal oxidation and is annealed in a hydrogen atmosphere at about 1,000 degrees C. As depicted in FIG. 9, a polycrystalline silicon layer doped with phosphorus is formed as a gate electrode (gate polysilicon) on the gate oxide film. After the patterning for the gate electrode, phosphoric glass is deposited as an interlayer insulating film having a thickness of 1.0 μm and, patterning and heat treatment therefor are executed. As depicted in FIG. 10, aluminum including 1% silicon (Al—Si) is deposited as a front face electrode having a thickness of 5 μm on the surface of the interlayer insulating film using the sputtering method. Nickel (Ni) is deposited as a contact metal film on the back face of the n-type semiconductor substrate 1 and heat treatment therefor is executed at 970 degrees C. Thereafter, titanium/nickel/gold (Ti/Ni/Au) is deposited as a metal film. The device is completed after applying a passivation film (not depicted) to protect the device structure on the front face of the n-type semiconductor substrate 1.

Figure 5:
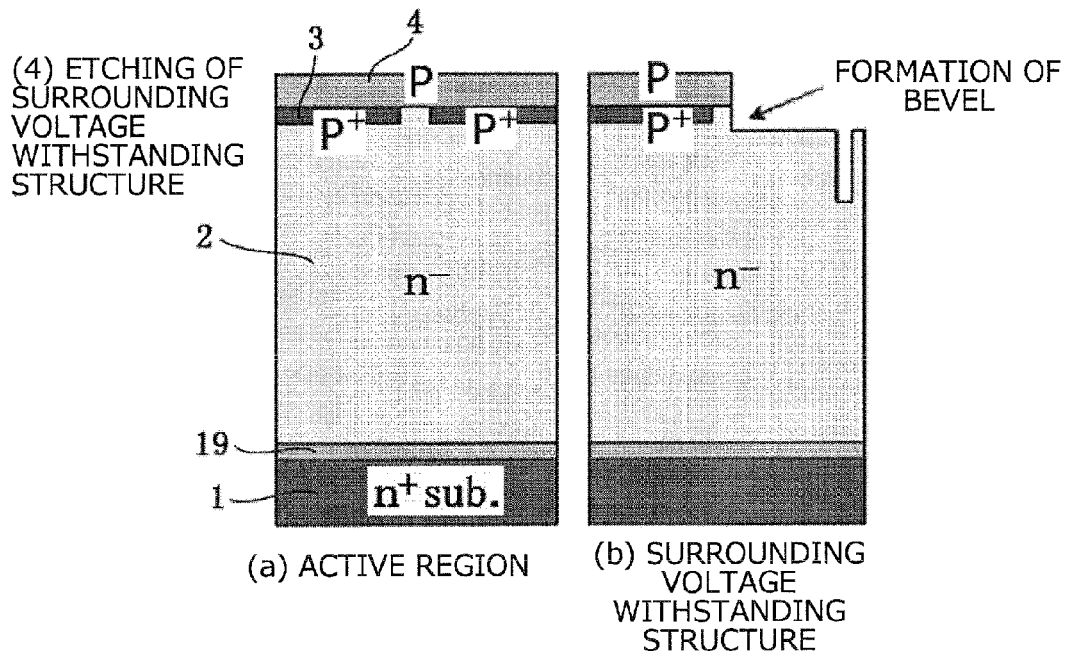
FIG. 5 is a cross-sectional diagram of the SiC-MOSFET fabrication process (formation of an edge termination structure) of the first example of the present invention.
Figure 11:
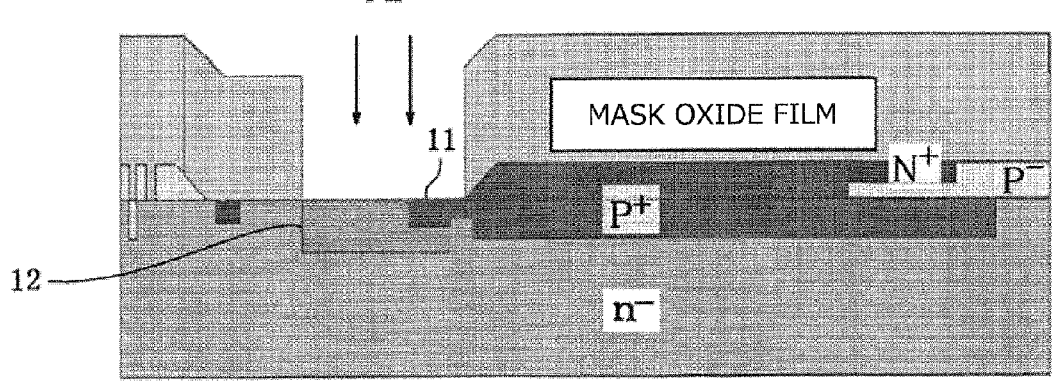
FIG. 11 is a cross-sectional diagram of the SiC-MOSFET fabrication process (ion implantation into the edge termination structure) of the first example of the present invention.

FIG. 5 is a cross-sectional diagram of the SiC-MOSFET fabrication process (formation of an edge termination structure) of the first example of the present invention. In the above fabrication process, to form the edge termination structure, the P-base layer 4 is epitaxially grown as depicted in FIG. 2 and, thereafter, a portion of the P-base layer 4 is etched to a depth of, for example, 0.7 μm to form a bevel as depicted in FIG. 5. FIG. 11 is a cross-sectional diagram of the SiC-MOSFET fabrication process (ion implantation into the edge termination structure) of the first example of the present invention. As depicted in FIG. 11, aluminum ions are implanted into the n-type SiC layer 2 exposed in the etched surface to form the P$^-$-layer 11. Here, ion implantation is executed to form the layout for the P$^+$-layer 3 and the P-base layer 4 in the active region to have a distance of about 0.2 μm therebetween. Preferably, the distance between the P$^-$-layer 11 at the innermost perimeter of the P-layers constituting the JTE layer, and the P$^+$-layer 3 and the P-base layer 4 in the active region is 20 μm or less. The reason for this is that, when high voltage is applied between the source and the drain, the depletion layer is stably expanded by setting the distance to be 20 μm or less. The ion dose amount here is set to be $6.0 \times 10^{13}$ cm$^{-2}$. To form the P$^{---}$-layer 12 outside the P$^-$-layer 11, aluminum ions at a lower concentration are implanted with the dose amount of $1.0 \times 10^{13}$ cm$^{-2}$. Similarly, activation annealing for the P$^-$-layer 11 and the P$^{---}$-layer 12 is executed based on the condition of, for example, the heat treatment temperature of 1,620 degrees C. and the time period of two minutes. The electric properties were verified of the SiC-MOSFET produced (manufactured) according to the fabrication process of the high voltage semiconductor apparatus according to the embodiment. To simulate the dispersion of the ion implantation concentrations of the P$^-$-layer 11 and the P$^{---}$-layer 12 forming the JTE layer, such devices were concurrently produced experimentally as those with the ion implantation amounts varied by amounts greater than or equal to ±50% relative to the above ion implantation amounts to form the P$^-$-layer 11 and the P$^{---}$-layer 12 (hereinafter, referred to as "the present example").

FIG. 14 is a table showing the breakdown voltages obtained when the dose amounts for the P$^-$-layer 11 and the P$^{---}$-layer 12 in the conventional example are varied (1,200 V/25 A rating). FIG. 15 is a table showing the breakdown voltages obtained when the dose amounts for the P$^-$-layer 11 and the P$^{---}$-layer 12 in the present example are varied (1,200 V/25 A rating). The measurement results of the breakdown voltage of the SiC-MOSFET produced as above are shown in the table depicted in FIG. 15. The die size of the measured device was 3 mm×3 mm, the active area thereof was 5.73 mm$^2$, and the rated current thereof was 25 A. For comparison, a conventional device, whose P$^-$-layer 11, and the P$^+$-layer 3 and the P-base layer 4 in the active region are in contact with each other (hereinafter, referred to as "conventional example"), was concurrently produced experimentally and evaluated. The breakdown voltage of the conventional example is shown in the table of FIG. 14. Based on the results depicted in FIGS. 14 and 15, the breakdown voltages obtained when the dose amount for the P$^-$-layer 11 and the p$^{---}$-layer 12 is $6.0 \times 10^{13}$ cm$^{-2}$ or $1.0 \times 10^{13}$ cm$^{-2}$ did not substantially differ, 1,450 V and 1,451 V for the present example and the conventional example, respectively. However, it was confirmed that when a difference was present in the impurity concentrations between the P$^-$-layer 11 and the P$^{---}$-layer 12, the breakdown voltage is reduced for the conventional example The structure of the P$^-$-layer 11 and the P$^{---}$-layer 12 of the device in the present example are designed such that the breakdown voltage thereof is 1,400 V or higher with the above dose amounts. From this result, with the device structure of the present example, even when a difference is present in the impurity concentration between the P$^-$-layer 11 and the P$^{---}$-layer 12, the breakdown voltage is not substantially affected. In contrast, with the device structure of the conventional example whose P$^-$-layer 11, and whose P$^+$-layer 3 and whose P-base layer 4 in the active region are in contact with each other, it can be seen that the breakdown voltage is reduced by about 100 V when the dose amount differs by 20%. In particular, the P$^-$-layer 11 and the P$^{---}$-layer 12 are formed by the ion implantation method at low concentrations and therefore, differences in the impurity concentration tend to be generated after the ion implantation. Based on this, it can be seen that, as to the device according to the present invention, the breakdown voltage does not substantially vary with respect to the differences arising from the ion implantation process and the device presents a sufficient breakdown voltage.

Figure 12:
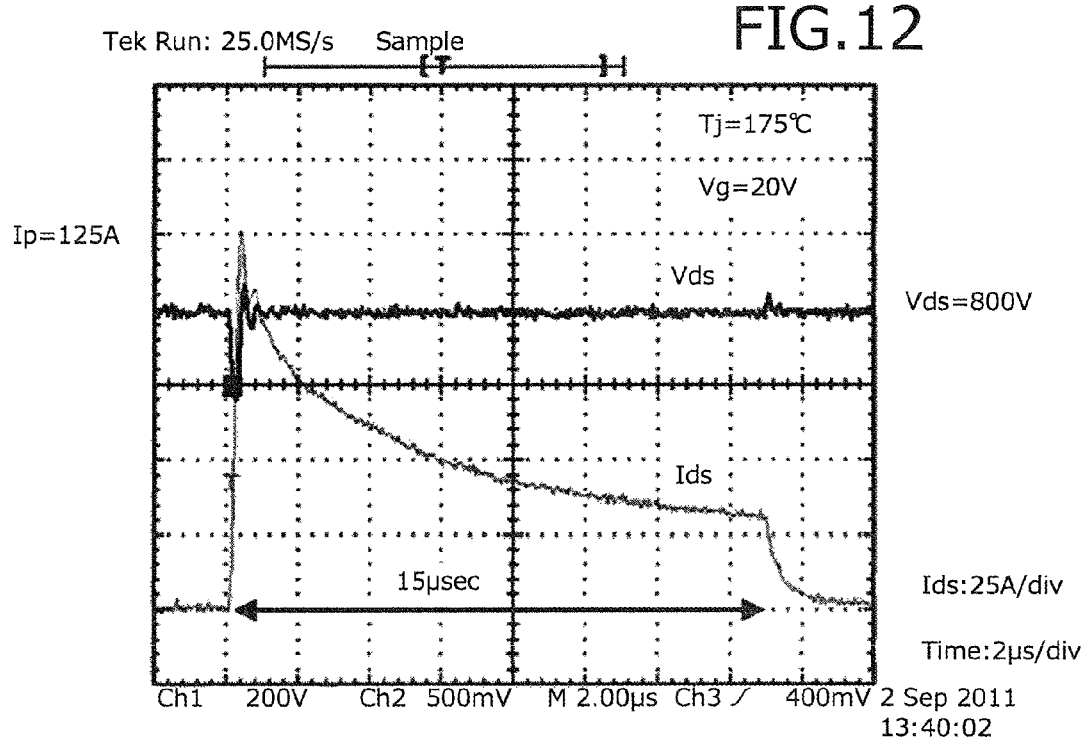
FIG. 12 depicts an evaluation result of a turn-off capability of the SiC-MOSFET of the present example.
Figure 13:
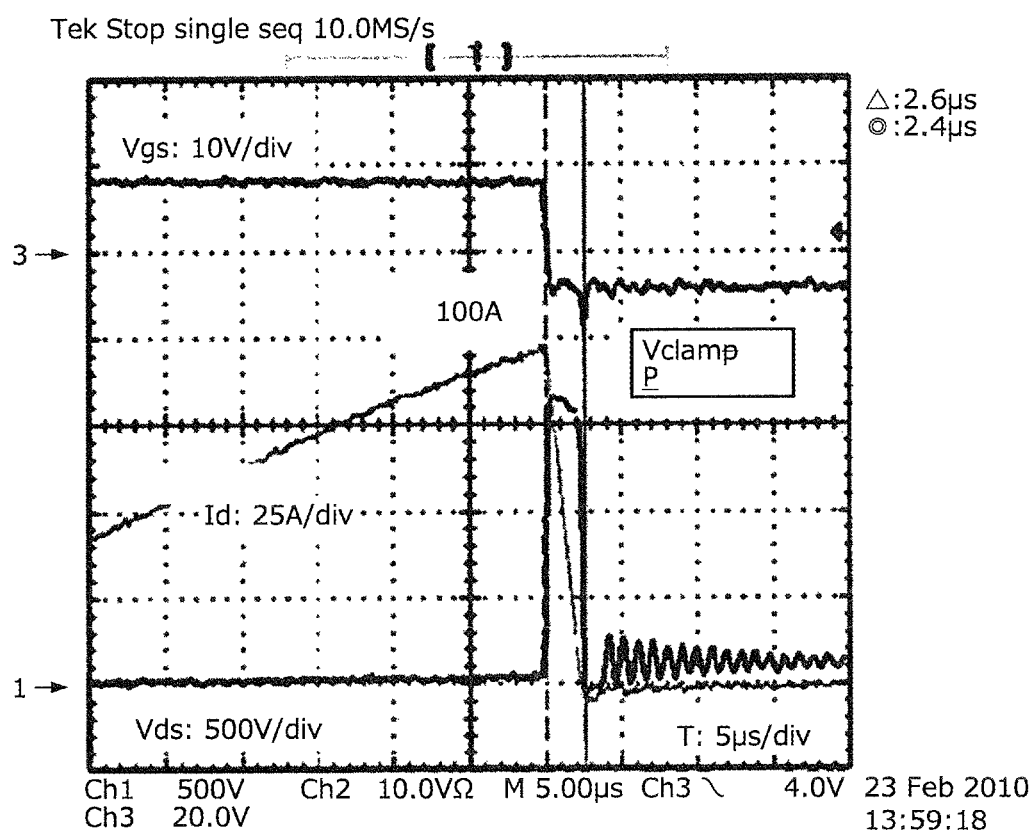
FIG. 13 is a table showing breakdown voltages obtained when the dose amounts are varied for the P$^-$-layer 11 and the P$^{---}$-layer 12 of the present example (1,200 V/25 A rating)

A short-circuit capability was measured on the device according to the present example. FIG. 12 depicts an evaluation result of a turn-off failure capability of the SiC-MOSFET of the present example. FIG. 13 is a table showing the breakdown voltages obtained when the dose amounts are varied for the P$^-$-layer 11 and the P$^{---}$-layer 12 of the present example (1,200 V/25 A rating). The bias voltage is directly applied between the source and the drain and, in this state, the voltage of Vg=20 V was applied to the gate electrode, and for how many μ sec the device does not fail is evaluated. The bias voltage is set to be Vds=800 V and the temperature for the measurement is set to be 175 degrees C. The schematic diagram of the measured waveform is as depicted in FIG. 12.

As depicted in FIG. 12, the device according to the present example showed a sufficient property in that the device did not fail even with the highest current of 250 A conducted therethrough, which was five times as high as the rated current and did not fail even for 15 μsec. When the turn-off capability was further evaluated, as depicted in FIG.

13, the voltage between the source and the drain was clamped at 1,630 V (the voltage represented by Vclamp P in FIG. 13) and it was confirmed that a current of 100 A (a current four times as high as the rated current) was able to be turned off at 150 degrees C. without any damage.

Based on this, it can be seen that with respect to not only the static breakdown voltage but also the dynamic withstanding capability such as the short-circuit capability and the turn-off capability, the device according to the present invention is not substantially affected by differences arising from processing, and a device can be realized that presents an extremely high withstanding capability.

The evaluation was also executed for devices for which surfaces inclined by zero degrees, two degrees, eight degrees, and 10 degrees with respect to a surface whose crystallographic plane indices were (000-1) were each set to be the principal surface (the front face) of the n-type semiconductor substrate 1; the n-type SiC layer 2 was formed on this principal surface similar to the first example; and a device structure identical to that of the first example was formed. As a result, the same properties as those of the first example were presented and were excellent.

Second Example

A second example will be described. A SiC-MOSFET was manufactured having the rated voltage of 1,200 V and the rated current of 25 A, using the same fabrication process as that of the first example. However, in the second example, a surface inclined by about four degrees with respect to the surface whose crystallographic plane indices were (0001) was set to be the principal surface (the front face) of the n-type semiconductor substrate 1; the n-type SiC layer 2 including nitrogen at about $1.8 \times 10^{16}$ cm$^{-3}$ was epitaxially grown to have a thickness of about 10 μm on the principal surface. The other processes, cell structures, and the edge termination structure of the second example were the same as those of the first example.

The breakdown voltage, the short-circuit capability, and the turn-off capability were evaluated of the manufactured device according to the second example. As a result, it was confirmed that substantially the same properties as those of the first example were presented. The evaluation was also executed for devices for which surfaces inclined by zero degrees, two degrees, eight degrees, and 10 degrees with respect to a surface whose crystallographic plane indices were (0001) were each set to be the principal surface (the front face) of the n-type semiconductor substrate 1; the n-type SiC layer 2 was formed on this principal surface similar to the second example; and a device structure identical to that of the second example was formed. As a result, the same properties as those of the second example were presented and were excellent.

Third Example

A third example will be described. In the third example, the n-type semiconductor substrate 1 made of SiC was prepared. In this case, the low resistivity SiC semiconductor (n-type semiconductor substrate) 1 was prepared that included nitrogen at about $2 \times 10^{19}$ cm$^{-3}$ as the impurity. A surface inclined by about four degrees with respect to the surface whose crystallographic plane indices were (000-1) was set to be the principal surface (the front face) of the n-type semiconductor substrate 1, and the n-type SiC layer 2 including nitrogen at about $1.8 \times 10^{16}$ cm$^{-3}$ was epitaxially grown to have a thickness of about 10 μm on this principal surface. The P-base layer 4 was formed by the ion implantation method having, for example, a width of 13 μm and a depth of 0.5 μm in the surface layer of the n-type SiC layer 2. Aluminum was used as the impurity ion-implanted in the ion implantation for forming the P-base layer 4. The dose amount thereof was set such that the impurity concentration of the P-base layer 4 was $1.0 \times 10^{16}$ cm$^{-3}$. The N$^+$-source layer 7 and the P$^+$-contact layer 8 were selectively formed inside the P-base layer 4 and, thereafter, activation annealing therefor was executed. The heat treatment temperature of the activation annealing was set to be 1,620 degrees C. and the time period thereof was set to be two minutes. Thereafter, the gate oxide film was formed by thermal oxidation to have a thickness of 100 nm and was annealed in a hydrogen atmosphere at about 1,000 degrees C. A polycrystalline silicon layer doped with phosphorus was formed as a gate electrode on the gate oxide film, and the patterning for the gate electrode was executed. Thereafter, phosphoric glass having a thickness of 1.0 μm was deposited as an interlayer insulating film covering the gate electrode, and patterning therefor and heat treatment therefor were executed. Aluminum including 1% silicon was deposited as a front face electrode having a thickness of 5 μm on the surface of the interlayer insulating film using the sputtering method. Nickel (Ni) was deposited as a contactmetal film on the back face of the n-type semiconductor substrate 1 and heat treatment therefor was executed at 970 degrees C. Thereafter, Ti/Ni/Au was deposited as a metal film. The device was completed after applying a passivation film to protect the front face device.

In the edge termination structure unit, after forming the P-base layer 4, aluminum ions were implanted as the P$^-$-layer 11 outside the P-base layer 4. Here, the ion implantation was executed at a position 0.2 μm from the P-base layer 4 in the active region. The dose amount here was set to be $6.0 \times 10^{13}$ cm$^{-2}$. To form the P$^{--}$-layer 12 outside thereof, aluminum ions were implanted to be at a lower concentration of $1.0 \times 10^{13}$ cm$^{-2}$. The activation annealing for the P$^-$-layer 11 and the P$^{--}$-layer 12 was executed similarly as above at the heat treatment temperature of 1,620 degrees C. and for the time period of two minutes. To simulate differences in ion implantation concentrations of the P$^-$-layer 11 and the P$^{--}$-layer 12, such devices were concurrently produced experimentally as those with the ion implantation amounts varied by amounts greater than or equal to ±50% with respect to the above ion implantation amounts.

The breakdown voltage was measured of the electric properties of the SiC-MOSFET manufactured as above. For comparison, concerning the 1,200 V/25 A rating, the breakdown voltages that was obtained when the dose amounts were varied for the P$^-$-layer 11 and the P$^{--}$-layer 12 of the conventional example is depicted in FIG. 14, and the breakdown voltages of the present example is depicted in FIG. 15. Similar to the first example, the devices measured in this case each had the die size of 3 mm×3 mm, the active area of 5.72 mm$^2$, and the rated current of 25 A.

As described, the same effect can be achieved as that of the first example.

The evaluation was also executed for devices for which surfaces inclined by zero degrees, two degrees, eight degrees, and 10 degrees with respect to the surface whose crystallographic plane indices were (000-1) were each set to be the principal surface (the front face) of the n-type semiconductor substrate 1; the n-type SiC layer 2 was formed on this principal surface similar to the third example; and a device structure identical to that of the third example was formed. As a result, the same properties as those of the third example were presented and were excellent.

Fourth Example

A MOSFET whose rated voltage was 1,200 V and whose rated current was 25 A, was manufactured according to a fabrication process identical to that of the third example. However, in a fourth example, a surface inclined by about four degrees with respect to a surface whose crystallographic plane indices were (0001) was set as the principal surface (the front face) of the n-type semiconductor substrate 1. The n-type SiC layer 2 including nitrogen at about $1.8 \times 10^{16}$ cm$^{-3}$ was epitaxially grown to have a thickness of about 10 μm on the principal surface. Other process steps of the fourth example were the same as those of the third example. The breakdown voltage, the short-circuit capability, and the turn-off capability were evaluated of the device of the fourth example. As a result, it was confirmed that substantially the same properties as those of the third example were presented.

The evaluation was also executed for devices for which surfaces inclined by zero degrees, two degrees, eight degrees, and 10 degrees with respect to a surface whose crystallographic plane indices were (0001) were each set to be the principal surface (the front face) of the n-type semiconductor substrate 1; the n-type SiC layer 2 was formed on this principal surface similar to the fourth example; and a device structure identical to that of the fourth example was formed. As a result, the properties did not substantially vary and were excellent.

Although not described in the examples, it is obvious that the present invention is also applicable to an IGBT that uses a semiconductor substrate of a conductivity type different from that of the MOSFET, and to a Schottky barrier diode (SBD) and a PiN diode that each use such a semiconductor substrate.

As described, according to the present invention, a MOSFET, an IGBT, an SBD, and a PiN diode can be provided that each has low ON-resistance and a high failure resistance level maintaining a sufficient breakdown voltage with respect to differences arising from processing at the time of ion implantation for the edge termination structure regardless of the crystallographic plane direction of the substrate.

INDUSTRIAL APPLICABILITY

As described, the high voltage semiconductor apparatus according to the present invention is useful for a power semiconductor apparatus used in a power conversion equipment such as a motor control inverter or an uninterruptible power supply (UPS).

EXPLANATIONS OF LETTERS OR NUMERALS 1 n-type semiconductor substrate
2 n-type SiC layer
3 P$^+$-layer
4 P-type base layer
6 N-layer
7 N$^+$-source layer
8 P$^+$-contact layer
11 P$^-$-layer
12 P$^{--}$-layer

The invention claimed is:
1. A high voltage semiconductor apparatus comprising:
a semiconductor substrate of a first conductivity type;
a first conductivity type semiconductor layer disposed on a front face of the semiconductor substrate and having an impurity concentration lower than that of the semiconductor substrate;
a second conductivity type semiconductor layer selectively disposed in a surface layer of the first conductivity type semiconductor layer;
a second conductivity type base layer having an impurity concentration lower than that of the second conductivity type semiconductor layer is disposed on the first conductivity type semiconductor layer and the second conductivity type semiconductor layer;
a first conductivity type source region selectively disposed inside the base layer;
a first conductivity type well region penetrating the base layer from a surface of the base layer along a direction of depth and reaching the first conductivity type semiconductor layer;
a gate electrode layer between the first conductivity type source region and the first conductivity type well region, and disposed through a gate insulating film in at least a portion of an exposed portion of the surface of the base layer;
a source electrode in contact with surfaces of the first conductivity type source region and the base layer;
a drain electrode disposed on a back face of the semiconductor substrate;
a recess penetrating a portion of the base layer in an edge termination portion along a direction of depth and reaching the first conductivity type semiconductor layer; and
second conductivity type layers disposed on a surface of the first conductivity type semiconductor layer exposed on a bottom face of the recess, and each having an impurity concentration lower than that of the second conductivity type semiconductor layer, wherein
the second conductivity type layer at an innermost perimeter is disposed such that the second conductivity type layer is not in contact with the second conductivity type semiconductor layer and the base layer.
2. The high voltage semiconductor apparatus according to claim 1, wherein
the first conductivity type semiconductor layer is an epitaxially grown layer,
the second conductivity type semiconductor layer is a diffusion layer formed using an ion implantation method,
the base layer is an epitaxially grown layer,
the first conductivity type source region is a diffusion layer formed using an ion implantation method, and
the first conductivity type well region is a diffusion layer formed using an ion implantation method.
3. The high voltage semiconductor apparatus according to claim 2, wherein
the first conductivity type semiconductor layer, the second conductivity type semiconductor layer, and the second conductivity type base layer are made of silicon carbide.
4. The high voltage semiconductor apparatus according to claim 3, wherein
the front face of the semiconductor substrate is a surface parallel to a surface whose crystallographic plane indices are (000-1) or a surface inclined by an angle within 10 degrees with respect thereto.

5. The high voltage semiconductor apparatus according to claim 3, wherein
the front face of the semiconductor substrate is a surface parallel to a surface whose crystallographic plane indices are (0001) or a surface inclined by an angle within 10 degrees with respect thereto.

6. The high voltage semiconductor apparatus according to claim 1, wherein
a distance between the second conductivity type layer at the innermost perimeter, and the second conductivity type semiconductor layer and the base layer is 20 μm or less.

7. The high voltage semiconductor apparatus according to claim 6, wherein
the first conductivity type semiconductor layer, the second conductivity type semiconductor layer, and the second conductivity type base layer are made of silicon carbide.

8. The high voltage semiconductor apparatus according to claim 7, wherein
the front face of the semiconductor substrate is a surface parallel to a surface whose crystallographic plane indices are (000-1) or a surface inclined by an angle within 10 degrees with respect thereto.

9. The high voltage semiconductor apparatus according to claim 7, wherein
the front face of the semiconductor substrate is a surface parallel to a surface whose crystallographic plane indices are (0001) or a surface inclined by an angle within 10 degrees with respect thereto.

10. The high voltage semiconductor apparatus according to claim 1, wherein
the first conductivity type semiconductor layer, the second conductivity type semiconductor layer, and the second conductivity type base layer are made of silicon carbide.

11. The high voltage semiconductor apparatus according to claim 10, wherein
the front face of the semiconductor substrate is a surface parallel to a surface whose crystallographic plane indices are (000-1) or a surface inclined by an angle within 10 degrees with respect thereto.

12. The high voltage semiconductor apparatus according to claim 10, wherein
the front face of the semiconductor substrate is a surface parallel to a surface whose crystallographic plane indices are (0001) or a surface inclined by an angle within 10 degrees with respect thereto.

* * * * *